(12) United States Patent
Urasaki et al.

(10) Patent No.: US 8,343,616 B2
(45) Date of Patent: *Jan. 1, 2013

(54) COATING AGENT, SUBSTRATE FOR MOUNTING OPTICAL SEMICONDUCTOR ELEMENT USING SAME, AND OPTICAL SEMICONDUCTOR DEVICE

(75) Inventors: Naoyuki Urasaki, Tsukuba (JP); Hayato Kotani, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/998,240

(22) PCT Filed: Sep. 25, 2009

(86) PCT No.: PCT/JP2009/066633
§ 371 (c)(1),
(2), (4) Date: May 10, 2011

(87) PCT Pub. No.: WO2010/038673
PCT Pub. Date: Apr. 8, 2010

(65) Prior Publication Data
US 2011/0278630 A1    Nov. 17, 2011

(30) Foreign Application Priority Data

Sep. 30, 2008   (JP) ............................... P2008-253226
Jan. 23, 2009   (JP) ............................... P2009-013319

(51) Int. Cl.
*B32B 27/20*   (2006.01)
*C08K 3/22*    (2006.01)
*H01L 33/46*   (2010.01)

(52) U.S. Cl. ................. 428/195.1; 257/99; 257/E33.06; 523/458

(58) Field of Classification Search .................. None
See application file for complete search history.

(56) References Cited

U.S. PATENT DOCUMENTS

| 6,048,944 A | 4/2000 | Epple et al. | |
| 7,989,840 B2 * | 8/2011 | Sanpei et al. | 257/100 |
| 2007/0295983 A1 * | 12/2007 | Haitko | 257/100 |
| 2009/0194320 A1 * | 8/2009 | Okumura | 174/256 |
| 2010/0140638 A1 * | 6/2010 | Kotani et al. | 257/98 |

FOREIGN PATENT DOCUMENTS

| CN | 1203621 A | 12/1998 |
| CN | 101136399 A | 3/2008 |
| DE | 43 17 317 A1 | 12/1994 |
| DE | 195 20 855 A1 | 11/1996 |
| DE | 103 49 394 A1 | 5/2005 |
| EP | 1 887 031 A1 | 2/2008 |
| EP | 1895602 A2 | 3/2008 |
| JP | 10-202789 | 8/1998 |
| JP | 10-202789 A * | 8/1998 |
| JP | 2003-60321 | 2/2003 |
| JP | 2003-60321 A * | 2/2003 |
| JP | 2006-156704 | 6/2006 |
| JP | 2006-316173 | 11/2006 |
| JP | 2007-131772 | 5/2007 |
| JP | 2007-235085 | 9/2007 |
| JP | 2008-001880 | 1/2008 |
| JP | 2008-1880 A * | 1/2008 |
| JP | 2008-085302 A | 4/2008 |
| KR | 10-2007-0086833 A | 8/2007 |
| WO | WO 9720898 A1 | 6/1997 |
| WO | WO 2005/040055 A1 | 5/2005 |
| WO | WO 2008/059856 A1 * | 5/2008 |
| WO | WO 2008/059865 A1 | 5/2008 |
| WO | WO 2008/111504 A | 9/2008 |

OTHER PUBLICATIONS

Derwent accession No. 2007-073340 for Japanese Patent No. 2006-316173 and U.S. Publication No. 2009/0194320, Okumura, Nov. 24, 2006, three pages.*

* cited by examiner

*Primary Examiner* — Robert Sellers
(74) *Attorney, Agent, or Firm* — Stites & Harbison, PLLC; Juan Carlos A. Marquez, Esq.

(57) ABSTRACT

The coating agent of the invention is a coating agent to be used between conductor members, comprising a thermosetting resin, a white pigment, a curing agent and a curing catalyst, the coating agent to be used between conductor members having a white pigment content of 10-85 vol % based on the total solid volume of the coating agent, and a whiteness of at least 75 when the cured product of the coating agent has been allowed to stand at 200° C. for 24 hours.

2 Claims, 4 Drawing Sheets

COATING AGENT, SUBSTRATE FOR MOUNTING OPTICAL SEMICONDUCTOR ELEMENT USING SAME, AND OPTICAL SEMICONDUCTOR DEVICE

TECHNICAL FIELD

The present invention relates to a coating agent to be used between conductor members and the like, and to a substrate for mounting an optical semiconductor element using the same, and an optical semiconductor device.

BACKGROUND ART

Light emitting diode (LED)-mounting printed circuit boards are known in the prior art which employ laminated sheets in which a titanium dioxide-containing epoxy resin is impregnated into a glass woven fabric and then heat cured, or laminated sheets which employ epoxy resins containing alumina in addition to titanium dioxide (see Patent documents 1-3, for example).

CITATION LIST

Patent Literature

[Patent document 1] Japanese Unexamined Patent Application Publication HEI No. 10-202789
[Patent document 2] Japanese Unexamined Patent Application Publication No. 2003-60321
[Patent document 3] Japanese Unexamined Patent Application Publication No. 2008-1880

SUMMARY OF INVENTION

Technical Problem

The conventional epoxy resin laminated sheets described in the patent literature cited above, however, while generally exhibiting an acceptable level of reflectance at the laminated sheet stage, often manifest large reduction in reflectance due to the heat treatment in the printed circuit board manufacturing steps or LED mounting step, or due to heating and photoirradiation during use after LED mounting. Discoloration therefore occurs by heat release during use after LED mounting, and this can potentially lower reliability for optical semiconductor device uses, such that further improvement is required.

The present invention has been accomplished in light of the aforementioned problems of the prior art, and its object is to provide a coating agent to be used between conductor members and the like, which is capable of forming a substrate such as a substrate for mounting an optical semiconductor element having high heat resistance, high optical reflectance in the visible light range and minimal reduction in optical reflectance caused by heat treatment or photoirradiation treatment, as well as a substrate for mounting an optical semiconductor element and an optical semiconductor device which employ the same.

Solution to Problem

In order to achieve the object stated above, the invention provides a coating agent to be used between conductor members, comprising a thermosetting resin, a white pigment, a curing agent and a curing catalyst, the coating agent to be used between conductor members having a white pigment content of 10-85 vol % based on the total solid volume of the coating agent, and a whiteness of at least 75 when the cured product of the coating agent has been allowed to stand at 200° C. for 24 hours.

According to the coating agent which has this composition and satisfies the aforementioned conditions of whiteness, and which is used between conductor members, it is possible to form a substrate, such as a substrate for mounting an optical semiconductor element, that has excellent heat resistance, excellent optical reflectance in the visible light range and adequately minimized reduction in optical reflectance caused by heat treatment or photoirradiation treatment.

The thermosetting resin is preferably an epoxy resin.

The invention further provides a coating agent to be used between conductor members and comprising an epoxy resin, a white pigment, an acid anhydride-based curing agent and a curing catalyst, the coating agent to be used between conductor members having a white pigment content of 10-85 vol % based on the total solid volume of the coating agent, wherein the epoxy resin is one such that the cured product of the epoxy resin and the acid anhydride-based curing agent has a transmittance of at least 75% for light with a wavelength of 365 nm, at a thickness of 1 mm.

According to the coating agent which has this composition and employs an epoxy resin satisfying the transmittance conditions specified above, and which is used between conductor members, it is possible to form a substrate, such as a substrate for mounting an optical semiconductor element, that has excellent heat resistance, excellent optical reflectance in the visible light range and adequately minimized reduction in optical reflectance caused by heat treatment or photoirradiation treatment.

The epoxy resin used in the coating agent of the invention is preferably an alicyclic epoxy resin or an epoxy resin with an isocyanurate skeleton. By using an alicyclic epoxy resin or an epoxy resin with an isocyanurate skeleton as the epoxy resin, it is possible to form a substrate, such as a substrate for mounting an optical semiconductor element, that can more satisfactorily prevent reduction in optical reflectance caused by heating or photoirradiation.

The white pigment in the coating agent of the invention is preferably at least one selected from the group consisting of titanium oxide, silica, alumina, magnesium oxide, antimony oxide, aluminum hydroxide, barium sulfate, magnesium carbonate, barium carbonate and magnesium hydroxide. Using such white pigments can form a substrate, such as substrate for mounting an optical semiconductor element, having more excellent optical reflectance in the visible light range.

The mean particle size of the white pigment in the coating agent of the invention is preferably 0.1-50 μm. Using a white pigment having a mean particle size in this range allows formation of a substrate, such as substrate for mounting an optical semiconductor element, which exhibits more excellent optical reflectance in the visible light range.

The invention still further provides a substrate for mounting an optical semiconductor element comprising a base material, a plurality of conductor members formed on the surface of the base material, and a white resin layer comprising a coating agent to be used between conductor members according to the invention, formed between the plurality of conductor members. A substrate for mounting an optical semiconductor element having a white resin layer comprising a coating agent formed between a plurality of conductor members exhibits excellent heat resistance and excellent optical reflectance in the visible light range, and has adequately minimized reduction in optical reflectance caused by heat treatment or photoirradiation treatment.

The invention still further provides an optical semiconductor device comprising an optical semiconductor element mounted on a substrate for mounting an optical semiconductor element of the invention as described above. Since the optical semiconductor device comprises a substrate for mounting an optical semiconductor element according to the invention, it exhibits excellent heat resistance and excellent optical reflectance in the visible light range, and has adequately minimized reduction in optical reflectance caused by heat treatment or photoirradiation treatment.

The invention still further provides a coating agent for use on a substrate for mounting an optical semiconductor element, the coating agent comprising a thermosetting resin and a white pigment, wherein the white pigment is titanium oxide.

The thermosetting resin preferably contains an alicyclic epoxy resin or an epoxy resin with an isocyanurate skeleton.

The invention still further provides a substrate for mounting an optical semiconductor element comprising a base material, a plurality of conductor members formed on the surface of the base material, and a white resin layer comprising a coating agent of the invention formed on the surface of the base material.

The invention still further provides an optical semiconductor device comprising an optical semiconductor element mounted on a substrate for mounting an optical semiconductor element of the invention as described above.

The invention still further provides a substrate for mounting an optical semiconductor element comprising a base material, a white resin layer formed on the surface of the base material and a conductor member, wherein the white resin layer is the cured product of a coating agent containing an epoxy resin and a white pigment.

The invention still further provides an optical semiconductor device comprising an optical semiconductor element mounted on a substrate for mounting an optical semiconductor element of the invention as described above.

Advantageous Effects of Invention

According to the invention it is possible to provide a coating agent to be used between conductor members and the like, which is capable of forming a substrate such as a substrate for mounting an optical semiconductor element having high heat resistance, high optical reflectance in the visible light range and minimal reduction in optical reflectance caused by heat treatment or photoirradiation treatment, as well as a substrate for mounting an optical semiconductor element and an optical semiconductor device which employ the same.

DESCRIPTION OF EMBODIMENTS

Figure 1:
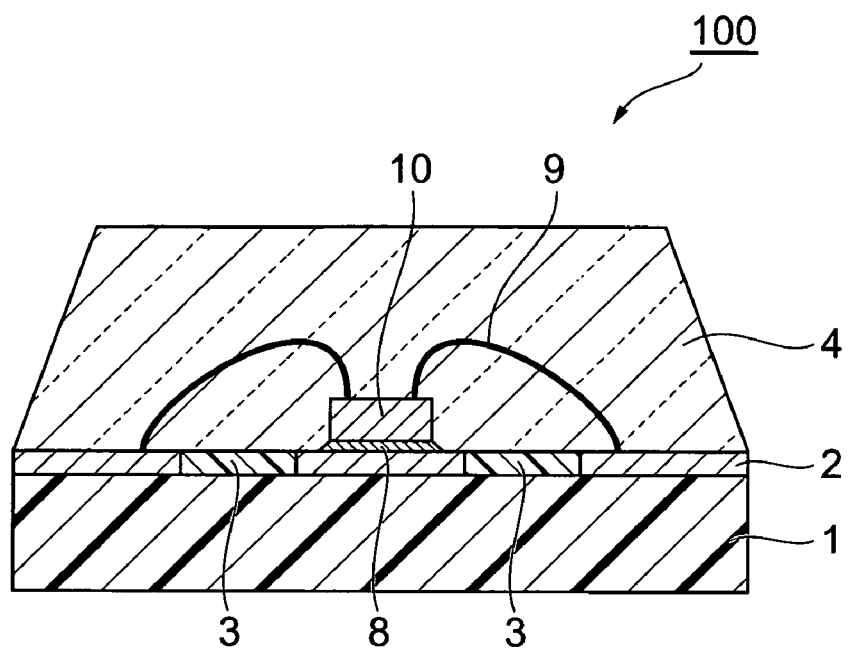
FIG. 1 is a schematic cross-sectional view showing a preferred embodiment of an optical semiconductor device according to the invention.

Preferred embodiments of the invention will now be explained in detail, with reference to the accompanying drawings as necessary. Identical or corresponding parts in the drawings will be referred to by like reference numerals and will be explained only once. Also, the dimensional proportions depicted in the drawings are not necessarily limitative.

(Coating Agent)

The coating agent according to the first embodiment of the invention is a coating agent comprising a thermosetting resin, a white pigment, a curing agent and a curing catalyst, wherein the white pigment content is 10-85 vol % based on the total solid volume of the coating agent, and the whiteness is at least 75 when the cured product of the coating agent has been allowed to stand at 200° C. for 24 hours.

The whiteness is determined by the following formula (I). The whiteness can be measured using a spectrocolorimeter.

$$W=100-\mathrm{sqr}[(100-L)^2+(a^2+b^2)] \quad (1)$$

(W: Whiteness, L: lightness, a: hue, b: chroma)

The curing conditions for the cured product of the coating agent are not particularly restricted so long as they are conditions allowing sufficient curing of the coating agent, but they are preferably conditions of 130-180° C., 0.5-10 hours.

The whiteness of the coating agent according to the first embodiment of the invention must be at least 75, but it is preferably at least 80 and especially preferably at least 90. The whiteness can be adjusted by the white pigment content, selection of the type of white pigment, and selection of the particle size of the white pigment. Increasing the whiteness can result in more uniform reflectance of light in the visible light region, i.e. it can improve the color rendering property. Titanium oxide may be mentioned as a suitable white pigment for increasing the whiteness. Titanium oxide can not only increase the whiteness but is also a white pigment with a high masking property, and can therefore prevent light-induced deterioration of the base material without providing a separate light shielding layer on the base material.

The coating agent according to the second embodiment of the invention is a coating agent comprising an epoxy resin, a white pigment, an acid anhydride-based curing agent and a curing catalyst, the coating agent having a white pigment content of 10-85 vol % based on the total solid volume of the coating agent, wherein the epoxy resin is one such that the cured product of the epoxy resin and the acid anhydride-based curing agent has a transmittance of at least 75% for light with a wavelength of 365 nm, at a thickness of 1 mm.

The transmittance can be measured using a spectrophotometer.

In the cured product of the epoxy resin and acid anhydride-based curing agent, the mixing ratio of the epoxy resin and the acid anhydride-based curing agent is the same as the mixing ratio of the epoxy resin and the acid anhydride-based curing agent in the coating agent according to the second embodiment of the invention.

The curing conditions for the cured product of the epoxy resin and acid anhydride-based curing agent are not particularly restricted so long as they are conditions that allow sufficient curing of the mixture of the epoxy resin and the acid anhydride-based curing agent, but they are preferably conditions of 130-180° C., 0.5-10 hours.

The transmittance of the coating agent according to the second embodiment of the invention must be at least 75%, but it is preferably at least 80% and especially preferably at least 85%. A high transmittance corresponds to low absorption of light by the resin. Therefore, increasing the transmittance can reduce loss of resin coloration and reduce deterioration of the cured product of the coating agent by light. This will allow the cured product of the coating agent to maintain high whiteness, and will allow a package with high color rendering to be provided.

According to the coating agent of the first and second embodiments of the invention, which is used between conductor members, it is possible to form a substrate for mounting an optical semiconductor element that exhibits excellent heat resistance and excellent optical reflectance in the visible light range, and can exhibit adequately minimized reduction in optical reflectance caused by heat treatment or photoirradiation treatment.

A coating agent according to the third embodiment of the invention is a coating agent for use on a substrate for mounting an optical semiconductor element, the coating agent comprising a thermosetting resin and a white pigment, wherein the white pigment is titanium oxide. Titanium oxide can not only increase the whiteness but is also a white pigment with a high masking property. Using the coating agent can therefore prevent deterioration of the base material by light, without providing a separate light shielding layer on the base material.

The components used in the coating agent of the invention will now be described.

The thermosetting resin used for the invention may be, for example, an epoxy resin, urethane resin, silicone resin or polyester resin, or a modified form of any of these resins. Among them, epoxy resins are preferred, with alicyclic epoxy resins and isocyanurate skeleton-containing epoxy resins being more preferred. From the viewpoint of more adequately minimizing reduction in optical reflectance due to photoirradiation, the epoxy resin preferably has as few aromatic rings as possible. Also, the thermosetting resin is preferably selected so that its cured product has high transparency. The thermosetting resin is preferably one with relatively low coloration. The thermosetting resin in the coating agent according to the second embodiment of the invention must be an epoxy resin.

Examples of alicyclic epoxy resins include 3,4-epoxycyclohexylmethyl-3',4'-epoxycyclohexane carboxylate {trade names: CELLOXIDE 2021, CELLOXIDE 2021A, CELLOXIDE 2021P (all products of Daicel Chemical Industries, Ltd.), ERL4221, ERL4221D, ERL4221E (all products of The Dow Chemical Company, Japan)}, bis(3,4-epoxycyclohexylmethyl)adipate {trade names: ERL4299 (product of The Dow Chemical Company, Japan), EXA7015 (product of Dainippon Ink and Chemicals, Inc.)}, 1-epoxyethyl-3,4-epoxycyclohexane, EPIKOTE YX8000, EPIKOTE YX8034, EPIKOTE YL7170 (all products of Japan Epoxy Resins Co., Ltd.), CELLOXIDE 2081, CELLOXIDE 3000, EPOLIDE GT301, EPOLIDE GT401, EHPE3150 (all products of Daicel Chemical Industries, Ltd.), and the like. Preferred alicyclic epoxy resins include 3,4-epoxycyclohexylmethyl-3',4'-epoxycyclohexane carboxylate, bis(3,4-epoxycyclohexylmethyl)adipate, EPIKOTE YX8000, EPIKOTE YX8034, EPOLIDE GT301, EPOLIDE GT401 and EHPE3150.

Examples of epoxy resins with isocyanurate skeletons include triglycidyl isocyanurate (trade name: TEPIC-S by Nissan Chemical Industries, Ltd.).

Other epoxy resins include bisphenol A-type epoxy resins and bisphenol S-type epoxy resins. Specific examples include EPIKOTE 828 and YL980 (products of Japan Epoxy Resins Co., Ltd.) and YSLV120TE (product of Tohto Kasei Co., Ltd.).

The thermosetting resin may be a single type or an appropriate combination of two or more types.

The thermosetting resin content of the coating agent is preferably 5-30 mass % and more preferably 10-20 mass % based on the total solid mass of the coating agent. If the content is less than 5 mass % the flow property will be reduced and the cured product will tend to be non-uniform, while if the content is greater than 30 mass % the reflectance will tend to be lowered.

The curing agent used for the invention may be used without any particular restrictions so long as it reacts with the thermosetting resin, but agents with relatively low coloration are preferred. Examples of such curing agents include acid anhydride-based curing agents, isocyanuric acid derivatives and phenol-based curing agents. The curing agent in the coating agent according to the second embodiment of the invention must be an acid anhydride-based curing agent.

Examples of acid anhydride-based curing agents include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, succinic anhydride, methylhexahydrophthalic anhydride, methyltetrahydrophthalic anhydride, norbornenedicarboxylic anhydride, methylnorbornenedicarboxylic anhydride, norbornanedicarboxylic anhydride and methylnorbornanedicarboxylic anhydride.

Isocyanuric acid derivatives include 1,3,5-tris(1-carboxymethyl)isocyanurate, 1,3,5-tris(2-carboxyethyl)isocyanurate, 1,3,5-tris(3-carboxypropyl)isocyanurate and 1,3-bis(2-carboxyethyl)isocyanurate.

According to the invention, phthalic anhydride, trimellitic anhydride, hexahydrophthalic anhydride, tetrahydrophthalic anhydride, methylhexahydrophthalic anhydride, methyltetrahydrophthalic anhydride, glutaric anhydride, dimethylglutaric anhydride, diethylglutaric anhydride and 1,3,5-tris(3-carboxypropyl)isocyanurate are preferred for use among the curing agents mentioned above.

The curing agent preferably has a molecular weight of 100-400, and is preferably colorless to pale yellow.

The curing agents may be used alone or in combinations of two or more.

The curing agent content of the coating agent is preferably 50-200 parts by mass and more preferably 100-150 parts by mass with respect to 100 parts by mass of the thermosetting resin. If the content is less than 50 parts by mass the curing will tend to not proceed adequately, and if the content is greater than 200 parts by mass the cured product will tend to be fragile and prone to coloration.

The curing catalyst (curing accelerator) used for the invention is not particularly restricted, and examples thereof include tertiary amines such as 1,8-diaza-bicyclo(5,4,0)undecene-7, triethylenediamine and tri-2,4,6-dimethylaminomethylphenol, imidazoles such as 2-ethyl-4-methylimidazole and 2-methylimidazole, phosphorus compounds such as triphenylphosphine, tetraphenylphosphonium tetraphenylborate, tetra-n-butylphosphonium-o,o-diethyl phosphorodithioate, tetra-n-butylphosphonium tetrafluoroborate and tetra-n-butylphosphonium tetraphenylborate, quaternary ammonium salts, organometallic salts, and derivatives of the foregoing. Any of these may be used alone or in combinations of two or more. Tertiary amines, imidazoles and phosphorus compounds are preferred among these curing accelerators.

The curing catalyst (curing accelerator) content of the coating agent is preferably 0.01-8 parts by mass and more preferably 0.1-3 parts by mass with respect to 100 parts by mass of the thermosetting resin. If the curing accelerator content is less than 0.01 part by mass a sufficient curing acceleration effect may not be obtained, and if it exceeds 8 parts by mass the obtained molded article may exhibit discoloration.

The white pigment used for the invention may be silica, alumina, magnesium oxide, antimony oxide, titanium oxide, zirconium oxide, aluminum hydroxide, magnesium hydroxide, barium sulfate, magnesium carbonate, barium carbonate, inorganic hollow particles, or the like. Any of these may be used alone or in combinations of two or more. From the viewpoint of thermal conductivity, photoreflectance, moldability and flame retardance, the white pigment is preferably one or a mixture of two or more selected from the group consisting of silica, alumina, magnesium oxide, antimony oxide, titanium oxide, zirconium oxide, aluminum hydroxide and magnesium hydroxide. Examples of inorganic hollow particles include sodium silicate glass, aluminum silicate glass, sodium borosilicate glass and white sand. From the viewpoint of photoreflectance, the white pigment preferably has a large difference in refractive index with respect to the thermosetting resin. Examples of preferred white pigments having large differences in refractive indexes with respect to thermosetting resins include titanium oxide and inorganic hollow particles, with titanium oxide being especially preferred.

The particle size of the white pigment is preferably in the range of 0.1-50 μm and more preferably in the range of 0.1-10 μm, as the mean particle size. If the mean particle size is less than 0.1 μm the particles will tend to aggregate and exhibit poor dispersibility, while if it is greater than 50 μm it may not be possible to obtain an adequate reflectance property. The mean particle size of the white pigment is that measured with a laser light particle size distribution meter, such as Beckman Coulter LS 13 320.

From the viewpoint of the flame-retardant effect, the white pigment is preferably aluminum hydroxide or magnesium hydroxide. These flame retardants are white and are preferred from the standpoint of their minimal effect on reflectance. From the viewpoint of moisture-proof reliability, aluminum hydroxide or magnesium hydroxide which have low ionic impurities are preferred, and for example, the Na compound content is preferably no greater than 0.2 mass %.

The mean particle size of the aluminum hydroxide or magnesium hydroxide is not particularly restricted, but from the viewpoint of flame retardance and flow property it is preferably 0.1-50 μm and more preferably 0.1-10 μm.

The content of aluminum hydroxide or magnesium hydroxide in the coating agent is preferably 10-30 mass % and more preferably 20-30 mass %, based on the total mass of the white pigment. With a content of less than 10 mass % the flame-retardant effect will tend to be inadequate, and with a content of greater than 30 mass % an undesirable effect will tend to be exhibited on the flow property and curability.

The white pigment content (loading amount) in the coating agent must be 10-85 vol % based on the total solid volume of the coating agent, and it is preferably 15-70 vol % and especially preferably 20-50 vol %. With a content of less than 10 vol % the photoreflectance will tend to be lowered, and with a content of greater than 85 vol % the moldability will tend to be impaired and fabrication of the substrate rendered more difficult.

A coupling agent may also be added to the coating agent of the invention to improve the dispersibility of the white pigment. Coupling agents include silane coupling agents and titanate-based coupling agents, with epoxysilane-based coupling agents being preferred from the viewpoint of coloration. Epoxysilane-based coupling agents include 3-glycidoxypropyltrimethoxysilane, 3-glycidoxypropyltriethoxysilane, 3-glycidoxypropylmethyldiethoxysilane, 3-glycidoxypropylmethyldimethoxysilane and 2-(3,4-epoxycyclohexyl)ethyltrimethoxysilane.

The coupling agent content of the coating agent is preferably no greater than 5 parts by mass with respect to 100 parts by mass of the white pigment.

In addition, antioxidants, light stabilizers, ultraviolet absorbers, release agents, ion scavengers, flexibilizers and the like may also be added as further additives to the coating agent of the invention. Suitable flexibilizers include acrylic resins, urethane resins, silicone resins, polyester resins, silicone/caprolactone block copolymers and the like.

A solvent may also be added to the coating agent of the invention. Examples of solvents include acetone, methyl ethyl ketone and ethylbutyl ketone. However, a coating agent of the invention having the composition described above is a liquid even in solventless form, and can form a film even without addition of a solvent. When it is in solventless form it is possible to eliminate the step of B-staging during film formation, and therefore the steps can be simplified and problems such as reduced optical reflectance occurring in the B-staging can be eliminated.

The coating agent of the invention has a 25° C. viscosity of preferably 5-200 Pa·s and more preferably 10-50 s. The viscosity of the coating agent is measured using an E-type viscometer. A viscosity of lower than 5 Pa·s will tend to result in thickness variation, while a viscosity of higher than 200 Pa·s will tend to impair the printing property.

(Substrate for Mounting an Optical Semiconductor Element and Optical Semiconductor Device)

The substrate for mounting an optical semiconductor element of the invention comprises a white resin layer formed between a plurality of conductor members (connecting terminals) on a base material, using a coating agent of the invention as described above. Alternatively, the substrate for mounting an optical semiconductor element of the invention comprises a base material, a plurality of conductor members formed on the surface of the base material, and a white resin layer comprising a coating agent of the invention as described above formed on the surface of the base material. Still alternatively, the substrate for mounting an optical semiconductor element according to the invention is a substrate for mounting an optical semiconductor element comprising a base material, a white resin layer formed on the surface of the base material and a conductor member, wherein the white resin layer is the cured product of a coating agent containing an epoxy resin and a white pigment. The optical semiconductor device of the invention comprises an optical semiconductor element mounted on a substrate for mounting an optical semiconductor element of the invention as described above.

FIG. 1 is a schematic cross-sectional view showing a preferred embodiment of an optical semiconductor device according to the invention. As shown in FIG. 1, the optical semiconductor device 100 is a surface mounted light emitting diode having an optical semiconductor element 10 mounted on a substrate for mounting an optical semiconductor element comprising a base material 1, a plurality of conductor members 2 formed on the surface of the base material 1, and a white resin layer 3 comprising a coating agent, formed around but not over and not under the plurality of conductor members (connecting terminals) 2, there being provided a transparent sealing resin 4 in such a manner that the optical semiconductor element 10 is sealed. In the optical semiconductor device 100, the optical semiconductor element 10 is bonded to one conductor member 2 by an adhesive layer 8, and is electrically connected to conductor members 2 by wires 9.

The base material 1 used is not particularly restricted if it is a base material used for substrates for mounting optical semiconductor elements, and for example, it may be a resin laminated sheet such as an epoxy resin laminated sheet.

The conductor members 2 function as connecting terminals, and may be formed by a known method such as, for example, photoetching of a copper foil.

The substrate for mounting an optical semiconductor element may be fabricated by coating the coating agent of the invention between a plurality of conductor members 2 on the base material 1, and heat curing it to form a white resin layer 3 composed of the coating agent.

The method of coating the coating agent of the invention on the substrate 1 may be a coating method such as, for example, printing, die coating, curtain coating, spray coating or roll coating.

The heating conditions for heat curing of the coating film of the coating agent are not particularly restricted, but heating at 130-180° C. for 30-600 minutes, for example, is preferred.

The excess resin component adhering to the surface of the conductor members 2 is then removed by buffing or the like, to expose the circuit composed of the conductor members 2 to form a substrate for mounting an optical semiconductor element.

In order to ensure adhesiveness between the white resin layer 3 and the conductor members 2, the conductor members 2 are preferably subjected to roughening by oxidation-reduction treatment or CZ treatment (Mec Co., Ltd.).

The substrate for mounting an optical semiconductor element of the invention has a surface formed only of the white resin layer 3 and the conductor members 2, and therefore the substrate for mounting an optical semiconductor element can be used to obtain an optical semiconductor device with adequately minimized degradation by heat or light and a long usable life. Furthermore, since the white resin layer 3 in the substrate for mounting an optical semiconductor element of the invention is situated only between the conductor members 2, it is possible to adequately prevent warping of the substrate for mounting an optical semiconductor element, compared to the case where the white resin layer 3 is formed over the entire surface of the base material 1, between the base material 1 and conductor members 2.

Figure 2:
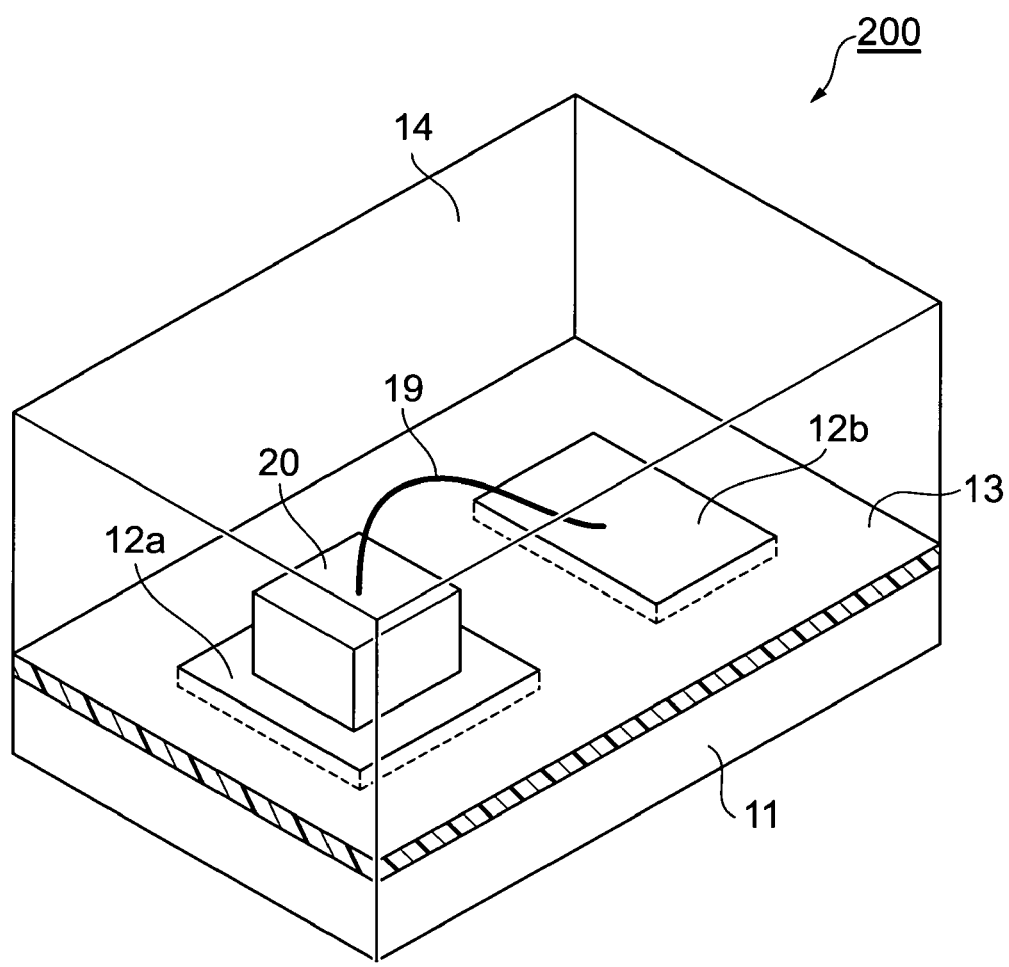
FIG. 2 is a perspective view showing another preferred embodiment of an optical semiconductor device according to the invention.
Figure 3:
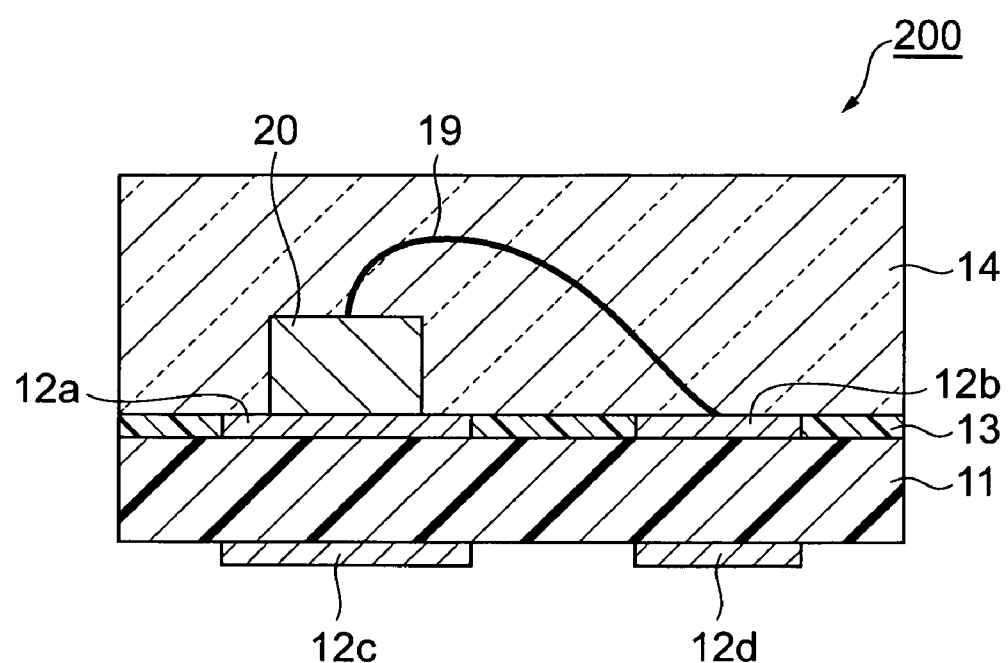
FIG. 3 is a schematic cross-sectional view of the optical semiconductor device shown in FIG. 2.
Figure 4:
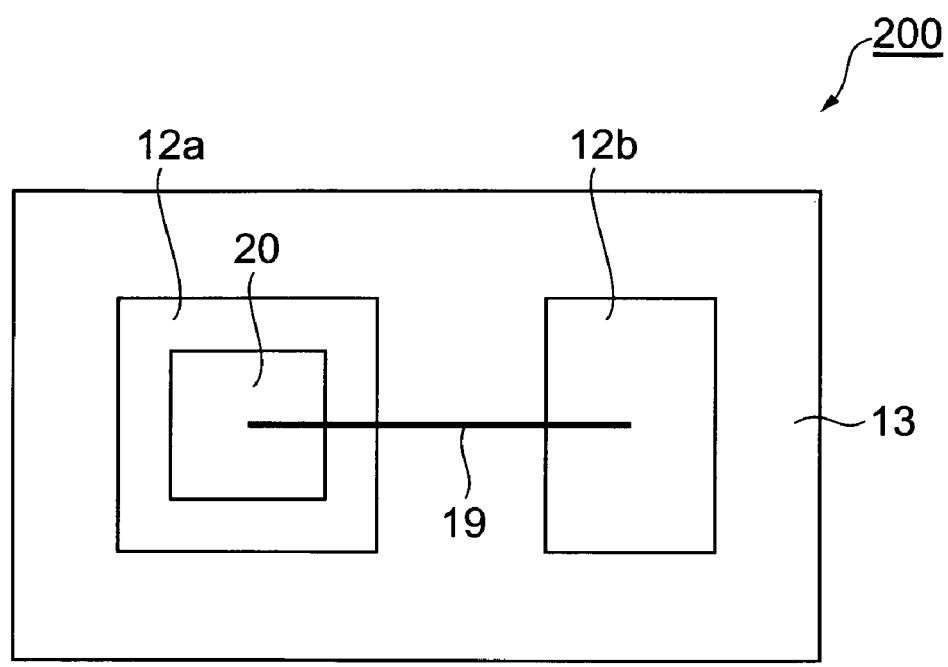
FIG. 4 is a plan view of the optical semiconductor device shown in FIG. 2.

FIG. 2 is a perspective view of another preferred embodiment of the optical semiconductor device of the invention, FIG. 3 is a schematic cross-sectional view of the optical semiconductor device shown in FIG. 2, and FIG. 4 is a plan view of the optical semiconductor device shown in FIG. 2.

As shown in FIGS. 2 to 4, the optical semiconductor device 200 is a surface mounted light emitting diode having an optical semiconductor element 20 mounted on a substrate for mounting an optical semiconductor element comprising a base material 11, a plurality of conductor members 12a, 12b formed on the surface of the base material 1, and a white resin layer 13 comprising a coating agent of the invention, formed on the surface of the base material 11, there being provided a transparent sealing resin 14 in such a manner that the optical semiconductor element 20 is sealed. In the optical semiconductor device 200, the optical semiconductor element 20 is bonded to a conductor member 12a, and is electrically connected to the other conductor member 12b by a wire 19. As shown in FIG. 3, the conductor members 12a, 12b are in electrical conduction with conductor members 12c, 12d provided on the rear side of the base material 11, via through-holes (not shown) running through the base material 11. The members composing the optical semiconductor device 200 are otherwise the same members as those composing the optical semiconductor device 100 shown in FIG. 1. In the optical semiconductor device 200 as well, the surface of the substrate for mounting an optical semiconductor element is formed only of the white resin layer 3 and conductor member 2, so that the same effect is obtained as with the optical semiconductor device 100 described above.

Preferred embodiments of the invention have been described above, but the invention is not limited to those embodiments.

EXAMPLES

The present invention will now be explained in greater detail through the following examples, with the understanding that these examples are in no way limitative on the scope of the invention.

Example 1

After mixing 100 parts by mass of triglycidyl isocyanurate (trade name: TEPIC-S, product of Nissan Chemical Industries, Ltd.) as a thermosetting resin (epoxy resin), 150 parts by mass of methylhexahydrophthalic anhydride (trade name: HN-5500F, product of Hitachi Chemical Co., Ltd.) as a curing agent (acid anhydride-based curing agent), 470 parts by mass of titanium oxide (trade name: FTR-700, product of Sakai Chemical Industry Co., Ltd., mean particle size: 0.2 µm) as a white pigment and 1.5 parts by mass of tetra-n-butylphosphonium-o,o-diethyl phosphorodithioate (trade name: PX-4ET, product of Nippon Chemical Industrial Co., Ltd.) as a curing catalyst (curing accelerator), the mixture was subjected to roll kneading under conditions with a kneading temperature of 20-30° C. and a kneading time of 10 minutes, to prepare a white coating agent. The viscosity of the obtained white coating agent was 10 Pa·s at 25° C.

Example 2

After mixing 100 parts by mass of the alicyclic epoxy resin CELLOXIDE 2021P (trade name of Daicel Chemical Industries, Ltd.) as a thermosetting resin (epoxy resin), 120 parts by mass of methylhexahydrophthalic anhydride (trade name: HN-5500F, product of Hitachi Chemical Co., Ltd.), 410 parts by mass of titanium oxide (trade name: FTR-700, product of Sakai Chemical Industry Co., Ltd.) and 1.5 parts by mass of tetra-n-butylphosphonium-o,o-diethyl phosphorodithioate (trade name: PX-4ET, product of Nippon Chemical Industrial Co., Ltd.), the mixture was subjected to roll kneading under conditions with a kneading temperature of 20-30° C. and a kneading time of 10 minutes, to prepare a white coating agent. The viscosity of the obtained white coating agent was 8 Pa·s at 25° C.

Example 3

After mixing 50 parts by mass of triglycidyl isocyanurate (trade name: TEPIC-S, product of Nissan Chemical Industries, Ltd.), 50 parts by mass of CELLOXIDE 2021P (trade name of Daicel Chemical Industries, Ltd.), 135 parts by mass of methylhexahydrophthalic anhydride (trade name: HN-5500F, product of Hitachi Chemical Co., Ltd.), 440 parts by mass of titanium oxide (trade name: FTR-700, product of Sakai Chemical Industry Co., Ltd.) and 1.5 parts by mass of tetra-n-butylphosphonium-o,o-diethyl phosphorodithioate (trade name: PX-4ET, product of Nippon Chemical Industrial Co., Ltd.), the mixture was subjected to roll kneading under conditions with a kneading temperature of 20-30° C. and a kneading time of 10 minutes, to prepare a white coating agent. The viscosity of the obtained white coating agent was 12 Pa·s at 25° C.

Example 4

A white coating agent was prepared in the same manner as Example 1, except that the epoxy resin (triglycidyl isocyanurate) was changed to a bisphenol A-type epoxy resin (trade name: YL980, product of Japan Epoxy Resins Co., Ltd.). The viscosity of the obtained white coating agent was 8 Pa·s at 25° C.

Example 5

A white coating agent was prepared in the same manner as Example 1, except that the epoxy resin (triglycidyl isocyanurate) was changed to a bisphenol S-type epoxy resin (trade name: YSLV 120TE, product of Tohto Kasei Co., Ltd.). The viscosity of the obtained white coating agent was 10 Pa·s at 25° C.

Comparative Example 1

A white coating agent was prepared in the same manner as Example 1, except that the epoxy resin (triglycidyl isocyanurate) was changed to a biphenyl-type epoxy resin. The viscosity of the obtained white coating agent was 12 Pa·s at 25° C.

(Measurement of Light Transmittance)

The epoxy resins and curing agents were mixed in the same mixing ratios as the white coating agents prepared in each of Examples 1-5 and Comparative Example 1. Each mixture was coated onto a released-treated PET die by casting and heat cured at 150° C. for 120 minutes, and then the release-treated PET was released to obtain a 1 mm-thick cured film composed of the epoxy resin and curing agent. The transmittance of the cured film for light with a wavelength of 365 nm was measured using a spectrophotometer (trade name: V-570 Spectrophotometer, product of JASCO Corp.). The results are shown in Table 1.

TABLE 1

| | Epoxy resin | Curing agent | Light transmittance [%] |
|---|---|---|---|
| Example 1 | TEPIC-S (100 parts by mass) | HN-5500F (150 parts by mass) | 87.4 |
| Example 2 | CELLOXIDE 2021P (100 parts by mass) | HN-5500F (120 parts by mass) | 81.3 |
| Example 3 | TEPIC-S (50 parts by mass) CELLOXIDE 2021P (50 parts by mass) | HN-5500F (135 parts by mass) | 84.2 |
| Example 4 | YL980 (100 parts by mass) | HN-5500F (150 parts by mass) | 78.0 |
| Example 5 | YSLV120TE (100 parts by mass) | HN-5500F (150 parts by mass) | 79.6 |
| Comp. Ex. 1 | YX4000 (100 parts by mass) | HN-5500F (150 parts by mass) | 53.6 |

(Measurement of Whiteness)

The white coating agents prepared in each of Examples 1-5 and Comparative Example 1 were coated onto an Al foil-attached die by casting and heat cured at 150° C. for 120 minutes, and then the Al foil was released to obtain a 1 mm-thick cured film composed of the white coating agent. The cured film was measured, using a spectrocolorimeter (trade name: CM-508d, product of Minolta), for L (lightness), a·b (hue/chroma), whiteness and reflectance of light with a wavelength of 460 nm, both initially and after standing at 200° C. for 24 hours. The results are shown in Table 2 (initial) and Table 3 (after standing at 200° C. for 24 hours).

TABLE 2

| Initial | Optical reflectance [%] | L | a | b | Whiteness |
|---|---|---|---|---|---|
| Example 1 | 90.05 | 95.93 | −0.39 | 1.90 | 95.5 |
| Example 2 | 91.11 | 96.37 | −0.26 | 1.79 | 95.9 |
| Example 3 | 90.65 | 96.03 | −0.3 | 1.80 | 95.6 |
| Example 4 | 88.10 | 95.08 | −0.29 | 1.90 | 94.7 |
| Example 5 | 90.26 | 96.14 | −0.28 | 1.85 | 95.7 |
| Comp. Ex. 1 | 90.61 | 96.26 | −0.31 | 2.14 | 95.7 |

TABLE 3

| After 200° C., 24 h | Optical reflectance [%] | L | a | b | Whiteness |
|---|---|---|---|---|---|
| Example 1 | 78.86 | 93.31 | −0.70 | 7.45 | 90.0 |
| Example 2 | 58.56 | 82.47 | 0.66 | 8.63 | 80.4 |
| Example 3 | 70.23 | 86.72 | 0.41 | 8.13 | 84.4 |
| Example 4 | 51.42 | 79.65 | 1.54 | 11.12 | 76.8 |
| Example 5 | 53.78 | 80.96 | 1.18 | 9.96 | 78.5 |
| Comp. Ex. 1 | 34.10 | 68.66 | 2.54 | 14.22 | 65.5 |

(Evaluation of Coloration and Optical Reflectance)

The presence or absence of coloration was visually confirmed in the cured film prepared for the measurement of whiteness. Absence of coloration (whiteness) was evaluated as "A", and presence of coloration was evaluated as "B". The reflectance of the cured film for light with a wavelength of 460 nm was measured using a spectrocolorimeter (trade name: CM-508d, product of Minolta). The results are shown in Table 4.

(Evaluation of Coloration and Optical Reflectance after Heat and Light Treatment)

The cured film prepared for the measurement of whiteness was irradiated for 2 hours with light of a wavelength of 240-380 nm at an irradiance of 0.22 W/cm$^2$ and a temperature of 200° C. Following the heat and light treatment, the presence or absence of coloration was visually confirmed. Absence of coloration (whiteness) was evaluated as "A", and presence of coloration was evaluated as "B". The reflectance of the cured film for light with a wavelength of 460 nm was measured using a spectrocolorimeter (trade name: CM-508d, product of Minolta). The results are shown in Table 4.

TABLE 4

| | | Example 1 | Example 2 | Example 3 | Example 4 | Example 5 | Comp. Ex. 1 |
|---|---|---|---|---|---|---|---|
| Coloration | Before heat/light treatment | A | A | A | A | A | A |
| | After heat/light treatment | A | A | A | A | A | B |
| Optical reflectance [%] | Before heat/light treatment | 90.05 | 91.11 | 90.65 | 88.10 | 90.26 | 90.61 |
| | After heat/light treatment | 86.12 | 81.01 | 82.83 | 76.95 | 77.84 | 67.89 |

As shown in Table 4, the white coating agents of Examples 1-5 had no coloration due to heat treatment or photoirradiation treatment, and reduction in optical reflectance was adequately prevented.

(Fabrication of Optical Semiconductor Device)

A substrate for mounting an optical semiconductor element with a copper foil conductor circuit formed thereon by photoetching was subjected to roughening of the conductor circuit by CZ treatment, and was then coated with each of the white coating agents of Examples 1-5 and Comparative Example 1 by printing to a thickness of 50 µm and heat cured at 150° C. for 2 hours, and then the excess resin adhering to the conductor circuit surface was removed by buffing to expose the conductor circuit, thereby forming a white resin layer between the conductor circuit. The conductor circuit was then subjected to nickel and silver plating, and an optical semiconductor element was die bonded. The optical semiconductor element and conductor circuit were electrically connected by wire bonding and sealed with a transparent sealing resin to fabricate an optical semiconductor device.

Using a substrate for mounting an optical semiconductor element having white resin layer comprising a coating agent of the invention formed between conductor members on a substrate surface, wherein the substrate surface is formed only of the white resin layer and conductor circuit, it is possible to obtain an optical semiconductor device with a long usable life, having adequately minimized heat and light degradation.

INDUSTRIAL APPLICABILITY

As explained above, it is possible according to the invention to provide a coating agent to be used between conductor members and the like, which is capable of forming a substrate such as a substrate for mounting an optical semiconductor element having high heat resistance, high optical reflectance in the visible light range and minimal reduction in optical reflectance caused by heat treatment or photoirradiation treatment, as well as a substrate for mounting an optical semiconductor element and an optical semiconductor device which employ the same.

EXPLANATION OF SYMBOLS

1,11: Base materials, 2,12: conductor members, 3,13: white resin layers, 4,14: sealing resins, 8: adhesive layer, 9,19: wires, 10,20: optical semiconductor elements, 100,200: optical semiconductor devices.

The invention claimed is:

1. A substrate for mounting an optical semiconductor element comprising a base material, a plurality of conductor members formed on the surface of the base material, and a white resin layer comprising a coating agent, formed on the surface of the base material, the coating agent comprising a thermosetting resin and a white pigment,
wherein the white pigment is titanium oxide, and the white resin layer is formed around but not over or under the plurality of conducting members.

2. An optical semiconductor device comprising an optical semiconductor element mounted on a substrate for mounting an optical semiconductor element according to claim 1.

\* \* \* \* \*